(12) United States Patent
Park

(10) Patent No.: US 11,749,704 B2
(45) Date of Patent: Sep. 5, 2023

(54) METHOD FOR FORMING PHOTOELECTRIC CONVERSION ELEMENT OF IMAGE SENSING DEVICE

(71) Applicant: SK hynix Inc., Icheon-si (KR)

(72) Inventor: Soon Yeol Park, Daejeon (KR)

(73) Assignee: SK HYNIX INC., Icheon-si (KR)

(*) Notice: Subject to any disclaimer, the term of this patent is extended or adjusted under 35 U.S.C. 154(b) by 253 days.

(21) Appl. No.: 16/905,634

(22) Filed: Jun. 18, 2020

(65) Prior Publication Data

US 2021/0134874 A1 May 6, 2021

(30) Foreign Application Priority Data

Nov. 4, 2019 (KR) .................. 10-2019-0139391

(51) Int. Cl.
*H01L 27/146* (2006.01)
*H04N 25/77* (2023.01)

(52) U.S. Cl.
CPC .... *H01L 27/14665* (2013.01); *H01L 27/1463* (2013.01); *H01L 27/14609* (2013.01); *H01L 27/14621* (2013.01); *H04N 25/77* (2023.01)

(58) Field of Classification Search
CPC ......... H01L 27/14665; H01L 27/14609; H01L 27/14621; H01L 27/1463; H01L 27/14627; H01L 27/14629; H01L 27/14685; H01L 27/14689; H01L 27/1461; H01L 27/14605; H01L 21/266; H01L 27/14692; H01L 27/14607; H01L 27/14625; H04N 5/3745; H04N 5/379
See application file for complete search history.

(56) References Cited

U.S. PATENT DOCUMENTS

| | | | |
|---|---|---|---|
| 2007/0145442 A1* | 6/2007 | Lim | .................. H01L 27/14698 257/E27.134 |
| 2009/0086066 A1 | 4/2009 | Itonaga | |
| 2011/0068397 A1 | 3/2011 | Disney | |
| 2011/0159635 A1 | 6/2011 | Doan et al. | |
| 2018/0219036 A1 | 8/2018 | Takahashi et al. | |
| 2018/0247969 A1 | 8/2018 | Mori et al. | |
| 2019/0157329 A1 | 5/2019 | Kim et al. | |

FOREIGN PATENT DOCUMENTS

| | | |
|---|---|---|
| CN | 110233159 A | 9/2019 |
| JP | 2009302448 A | 12/2009 |
| JP | 2010192483 A | 9/2010 |
| KR | 10-2010-0044994 A | 5/2010 |

* cited by examiner

*Primary Examiner* — Selim U Ahmed
(74) *Attorney, Agent, or Firm* — Perkins Coie LLP

(57) ABSTRACT

An image sensing device and a method for forming the same are disclosed. The image sensing device includes a first substrate, first photoelectric conversion elements formed in the first substrate and configured to generate photocharges in response to a reception of light, a second substrate formed over the first substrate, and second photoelectric conversion elements formed in the second substrate and configured to generate photocharges in response to a reception of light, the second photoelectric conversion elements contacting corresponding the first photoelectric conversion elements, respectively.

17 Claims, 5 Drawing Sheets

METHOD FOR FORMING PHOTOELECTRIC CONVERSION ELEMENT OF IMAGE SENSING DEVICE

CROSS-REFERENCE TO RELATED APPLICATION

This patent document claims the priority and benefits of Korean patent application No. 10-2019-0139391, filed on Nov. 4, 2019, which is incorporated by reference in its entirety as part of the disclosure of this patent document.

TECHNICAL FIELD

The technology and implementations disclosed in this patent document generally relate to an image sensing device and a method for forming the same.

BACKGROUND

An image sensor is a device for converting an optical image into electrical signals. With the recent development of computer industries and communication industries, demand for high-quality and high-performance image sensors is rapidly increasing in various fields, for example, digital cameras, camcorders, personal communication systems (PCSs), game consoles, surveillance cameras, medical micro-cameras, robots, etc.

SUMMARY

The disclosed technology relates to an image sensing device for increasing light efficiency.

The disclosed technology relates to a method for forming a photoelectric conversion element having a deep depth using low ion implantation energy.

In accordance with an embodiment of the disclosed technology, an image sensing device is provided to comprise: a plurality of first photoelectric conversion elements formed in a first substrate, and configured to generate photocharges through conversion of incident light; a second substrate formed over the first substrate; and a plurality of second photoelectric conversion elements formed in the second substrate in a manner that the second photoelectric conversion elements are formed to respectively contact the first photoelectric conversion elements, and configured to generate photocharges through conversion of incident light.

In accordance with an embodiment of the disclosed technology, an image sensing device may include a first substrate, first photoelectric conversion elements formed in the first substrate and configured to generate photocharges in response to a reception of light, a second substrate formed over the first substrate, and second photoelectric conversion elements formed in the second substrate and configured to generate photocharges in response to a reception of light, the second photoelectric conversion elements contacting corresponding the first photoelectric conversion elements, respectively.

In accordance with another embodiment of the disclosed technology, a method for forming an image sensing device is provided. The method includes A method for forming an image sensing device comprising: forming a first mask pattern in a first substrate; forming a first photoelectric conversion element by implanting first-type impurities into the first substrate using the first mask pattern as an ion implantation mask; growing a second substrate over the first substrate in which the first photoelectric conversion element is formed; forming a second mask pattern over the second substrate; and forming a second photoelectric conversion element in the second substrate in a manner that the second photoelectric conversion element contacts the first photoelectric conversion element, by implanting the first-type impurities into the second substrate using the second mask pattern as an ion implantation mask.

In accordance with another embodiment of the disclosed technology, a method for forming an image sensing device may include forming a first photoelectric conversion element in a first substrate by implanting first-type impurities into the first substrate, providing a second substrate over the first substrate, and forming a second photoelectric conversion element in the second substrate by implanting the first-type impurities into the second substrate.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of an image sensing device and a method for forming the same that substantially address one or more issues due to limitations and disadvantages of the related art. Some implementations of the disclosed technology suggest designs of an image sensing device for increasing light efficiency. Some implementations of the disclosed technology relates to a method for forming a photoelectric conversion element having a deep depth using low ion implantation energy. In recognition of the issues above, the disclosed technology provides various implementations of an image sensing device which can provide a photoelectric conversion element having a deep depth, resulting in an increased light efficiency.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
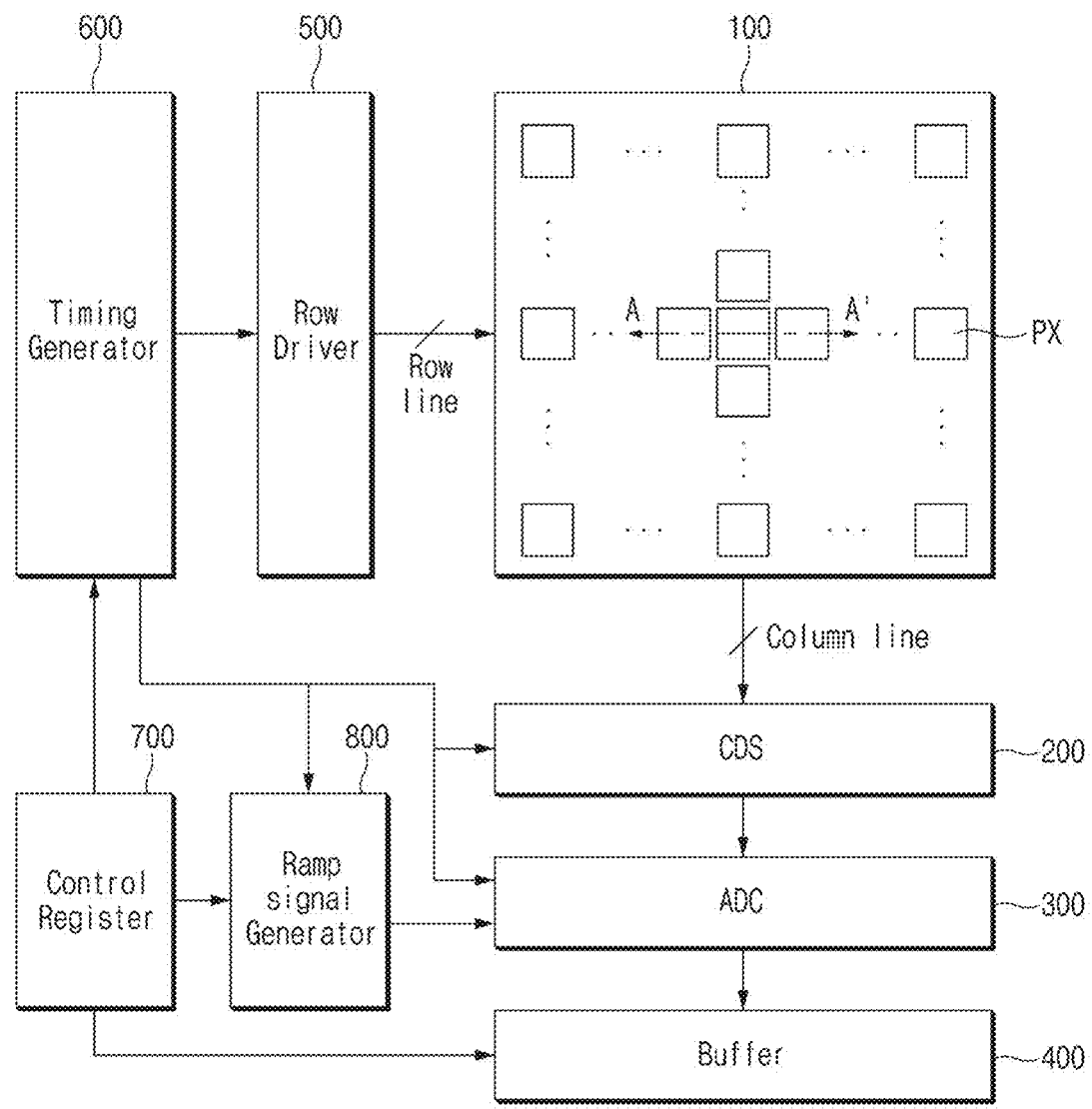
FIG. 1 is an example of a block diagram illustrating an image sensing device based on some implementations of the disclosed technology.

FIG. 1 is an example of a block diagram illustrating an image sensing device based on some implementations of the disclosed technology.

Referring to FIG. 1, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include unit pixels (PXs) consecutively arranged in a two-dimensional (2D) structure in which unit pixels are arranged in a first direction and a second direction perpendicular to the first direction. Each of the unit pixels (PXs) may convert incident light into an electrical signal to generate a pixel signal, and may output the pixel signal to the correlated double sampler (CDS) 200 through column lines. Each unit pixel (PX) may include a photoelectric conversion element formed in a substrate. In this case, each photoelectric conversion element may include a plurality of sub photoelectric conversion elements consecutively coupled to each other, such that each photoelectric conversion element may be formed in a stacked structure of the sub photoelectric conversion elements. Each of the unit pixels (PXs) may be coupled to one of row lines and one of column lines.

In some implementations, the image sensing device may use the correlated double sampler (CDS) to remove an offset value of pixels by sampling a pixel signal twice so that the difference is taken between these two samples. For example, the correlated double sampler (CDS) may remove an offset value of pixels by comparing pixel output voltages obtained before and after light is incident on the pixels, so that only pixel signals based on the incident light can be actually measured. The correlated double sampler (CDS) 200 may hold and sample electrical image signals received from the pixels (PXs) of the pixel array 100. For example, the correlated double sampler (CDS) 200 may perform sampling of a reference voltage level and a voltage level of the received electrical image signal in response to a clock signal received from the timing generator 600, and may transmit an analog signal corresponding to a difference between the reference voltage level and the voltage level of the received electrical image signal to the analog-to-digital converter (ADC) 300.

The analog-to-digital converter (ADC) 300 may compare a ramp signal received from the ramp signal generator 800 with a sampling signal received from the correlated double sampler (CDS) 200, and may thus output a comparison signal indicating the result of comparison between the ramp signal and the sampling signal. The analog-to-digital converter (ADC) 300 may count a level transition time of the comparison signal in response to a clock signal received from the timing generator 600, and may output a count value indicating the counted level transition time to the buffer 400.

The buffer 400 may store each of the digital signals received from the analog-to-digital converter (ADC) 300, may sense and amplify each of the digital signals, and may output each of the amplified digital signals. Therefore, the buffer 400 may include a memory (not shown) and a sense amplifier (not shown). The memory may store the count value, and the count value may be associated with output signals of the plurality of unit pixels (PXs). The sense amplifier may sense and amplify each count value received from the memory.

The row driver 500 may drive the pixel array 100 in units of a row line in response to an output signal of the timing generator 600. For example, the row driver 500 may generate a selection signal capable of selecting any one of the plurality of row lines.

The timing generator 600 may generate a timing signal to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate a ramp signal to control an image signal output to the buffer 400 in response to a control signal received from the control register 700 and a timing signal received from the timing generator 600. The ramp signal can be compared with electrical signals (e.g., the sampling signal) generated by pixels.

Figure 2:
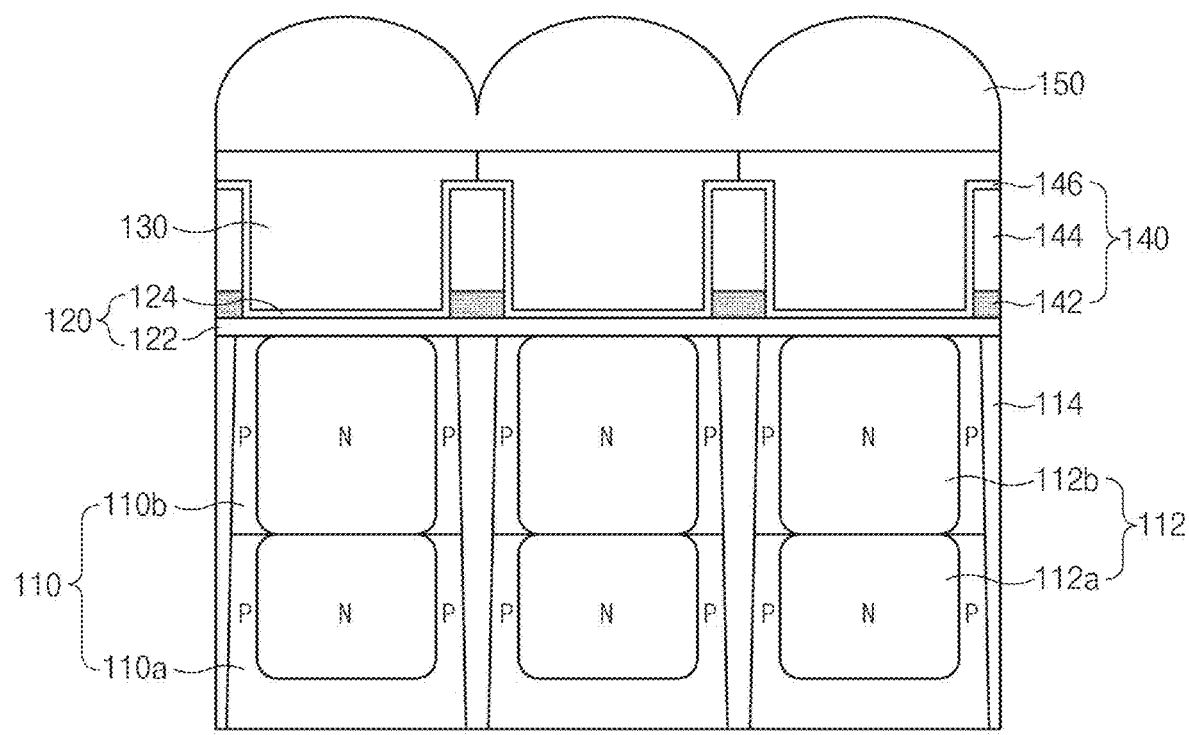
FIG. 2 is a cross-sectional view illustrating an example of a pixel array taken along the line A-A' shown in FIG. 1 based on some implementations of the disclosed technology.

FIG. 2 is a cross-sectional view illustrating an example of the pixel array taken along the line A-A' shown in FIG. 1 based on some implementations of the disclosed technology.

Referring to FIG. 2, the pixel array 100 of the image sensing device may include a substrate 110, a buffer layer 120, a color filter layer 130, a grid structure 140, and a lens layer 150.

The substrate 110 may include a first substrate 110a and a second substrate 110b. For example, the substrate 110 may include a stacked structure of the first substrate 110a and the second substrate 110b. The substrate 110 may include a semiconductor substrate having a first surface and a second surface opposite to the first surface.

In some implementations, a plurality of pixel transistors may be formed over a first surface, the first surface not contacting the second substrate 110b. The buffer layer 120, the color filter layer 130, the grid structure 140, and the lens layer 150 may be formed over the second surface not contacting the first substrate 110a.

The second substrate 110b may include a silicon epitaxial layer. For example, the second substrate 110b may include a monocrystalline silicon epitaxial layer that is formed by a selective epitaxial growth (SEG) process.

The substrate 110 may include P-type impurities. The substrate 110 may include a plurality of photoelectric conversion elements corresponding to the respective unit pixels (PXs).

The photoelectric conversion elements 112 may perform conversion of incident light received through the second surface of the substrate to generate photocharges. The photoelectric conversion elements 112 may be isolated per unit pixel (PX) by the device isolation film 114. Each of the photoelectric conversion elements 112 may include an organic or inorganic photoelectric material. In some implementations, the photoelectric conversion elements 112 may include photodiodes. P-type impurity regions may be formed between the device isolation film 114 and the photoelectric conversion elements 112.

Each photoelectric conversion element 112 may include a first photoelectric conversion element 112a and a second photoelectric conversion element 112b that are vertically stacked in the substrate 110. For example, the photoelectric conversion element 112 may include a first photoelectric conversion element 112a formed in the first substrate 110a and a second photoelectric conversion element 112b formed in the second substrate 110b. The first photoelectric conversion element 112a and the second photoelectric conversion element 112b may be stacked while simultaneously contacting each other, such that the stacked structure of the first photoelectric conversion element 112a and the second photoelectric conversion element 112b may be used as a single photoelectric conversion element 112.

The first photoelectric conversion element 112a may include N-type impurities implanted into the first substrate 110a through a first ion implantation process. The second photoelectric conversion element 112b may include N-type impurities implanted into the second substrate 110b through a second ion implantation process different from the first ion implantation process. Thus, the photoelectric conversion elements 112a and 112b according to the present embodiment may not be simultaneously formed through the same ion implantation process, and the first photoelectric conversion element 112a and the second photoelectric conversion element 112b may be formed separately from each other through different ion implantation processes, and may then be consecutively coupled to each other. N-type impurities may include phosphorous (P) ions or arsenic (As) ions.

Impurity density of the first photoelectric conversion element 112a may be higher than impurity density of the second photoelectric conversion element 112b. The first photoelectric conversion element 112a may have a width identical to that of the second photoelectric conversion element 112b. The device isolation film 114 may be formed in the substrate 100, and may isolate photoelectric conversion elements 112 from one another. The device isolation film 114 may include a trench-shaped device isolation film in which insulation materials are buried in a trench formed by etching of the substrate 100. For example, the device isolation film 114 may include a Deep Trench Isolation (DTI) structure formed to pass through the first substrate 110a and the second substrate 110b.

The buffer layer 120 may operate as a planarization layer to remove a step difference formed over the second surface of the substrate 110. In addition, the buffer layer 120 may operate as an anti-reflection film to allow incident light received through the lens layer 150 and the color filter layers 130 to pass through the photoelectric conversion elements 112. The buffer layer 120 may be formed of or include a multilayer structure formed by stacking different materials having different refractive indexes. For example, the buffer layer 120 may include a multilayer structure formed by stacking at least one nitride film 122 and at least one oxide film 124. The nitride film 122 may include a silicon nitride film ($Si_xN_y$, where each of 'x' and 'y' is a natural number) or a silicon oxide nitride film ($Si_xO_yN_z$, where each of 'x', 'y', and 'z' is a natural number). The oxide film 124 may include a monolayer structure formed of any one of an Undoped Silicate Glass (USG) film or an Ultra Low Temperature Oxide (ULTO) film, or may include a multilayer structure formed by stacking the USG film and the ULTO film. The oxide film 124 may be formed of or include the same material as the capping film 146 of the grid structure 140, and the oxide film 124 and the capping film 146 may be simultaneously formed through the same deposition process.

The color filter layer 130 may be formed over the second surface, may filter out a certain light, e.g., visible light, that is selected from incident light received through the lens layer 150, and may thus transmit only the filtered light. The color filter layer 130 may include a plurality of color filters, each of which is formed per unit pixel (PX), and the color filters may be gap-filled between the grid structures 140. The color filter layer 130 may include a plurality of red color filters (Rs), a plurality of green color filters (Gs), or a plurality of blue color filters (Bs). Each red color filter (R) may transmit only red light from among RGB lights of visible light. Each green color filter (G) may transmit only green light from among RGB lights of visible light. Each blue color filter (B) may transmit only blue light from among RGB lights of visible light. The red filters (Rs), the green filters (Gs), and the blue filters (Bs) may be arranged in a Bayer pattern shape. Alternatively, the color filter layer 130 may include a plurality of cyan filters, a plurality of yellow filters, and a plurality of magenta filters.

Each grid structure 140 may be disposed between color filters of unit pixels (PXs) adjacent to each other, and may prevent optical crosstalk from occurring between the color filters. The grid structure 140 may include a metal layer 142, an air layer 144, and a capping film 146. The capping film 146 may be a material film formed at an outermost part of the grid structure 140, and may perform capping of the air layer 144. The capping film 146 may be formed to extend to a lower portion of the color filter layer 130. In this case, the capping film formed below the color filter layer 130 may be used as the oxide film 124 of the buffer layer 120.

The lens layer 150 may be formed over the color filter layers 130, may converge incident light received from the outside, and may transmit the light to the color filter layers 130.

FIGS. 3A to 3D are cross-sectional views illustrating a method for forming the photoelectric conversion element shown in FIG. 2 based on some implementations of the disclosed technology.

Figure 3A:
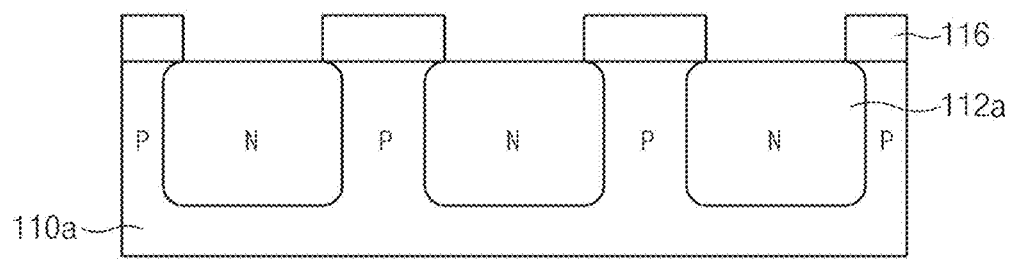
FIGS. 3A to 3D are cross-sectional views illustrating a method for forming a photoelectric conversion element shown in FIG. 2 based on some implementations of the disclosed technology.

In FIG. 3A, P-type impurities may be implanted into the first substrate 110a. For example, boron (B) ions with the low concentration may be implanted into the first substrate 110a as low-density P-type impurities.

Subsequently, a mask pattern 116 formed to define the first photoelectric conversion element 112a may be formed over the first substrate 110a. The mask pattern 116 may include a photoresist pattern.

Thereafter, N-type impurities may be implanted into the first substrate 110a using the mask pattern 116 as an ion implantation mask, resulting in formation of the first photoelectric conversion element 112a. The first photoelectric conversion element 112a may be formed to contact a top surface of the first substrate 110a, and may be spaced apart from a bottom surface of the first substrate 110a by a predetermined distance.

Figure 3B:
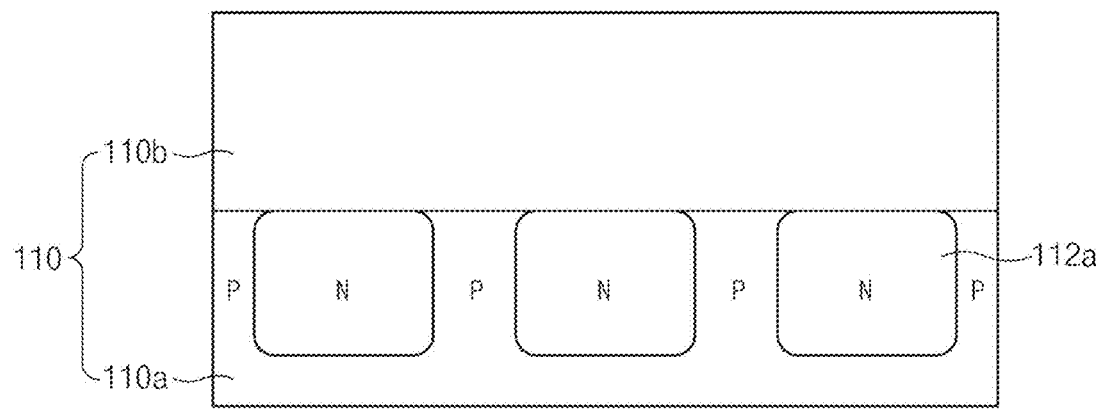

Referring to FIG. 3B, after the mask pattern 116 is removed, the second substrate 110b may be formed over the first substrate 110a in which the first photoelectric conversion element 112a is formed.

In some implementations, the second substrate 110b may include a silicon epitaxial layer. The silicon epitaxial layer may be formed by a selective epitaxial growth (SEG) process. The selective epitaxial growth (SEG) process may be carried out using at least one of a Chemical Vapor Deposition (CVD) process, a Reduced Pressure Chemical Vapor Deposition (RPCVD) process, an Ultra High Vacuum Chemical Vapor Deposition (UHVCVD) process, etc., without being limited thereto.

Figure 3C:
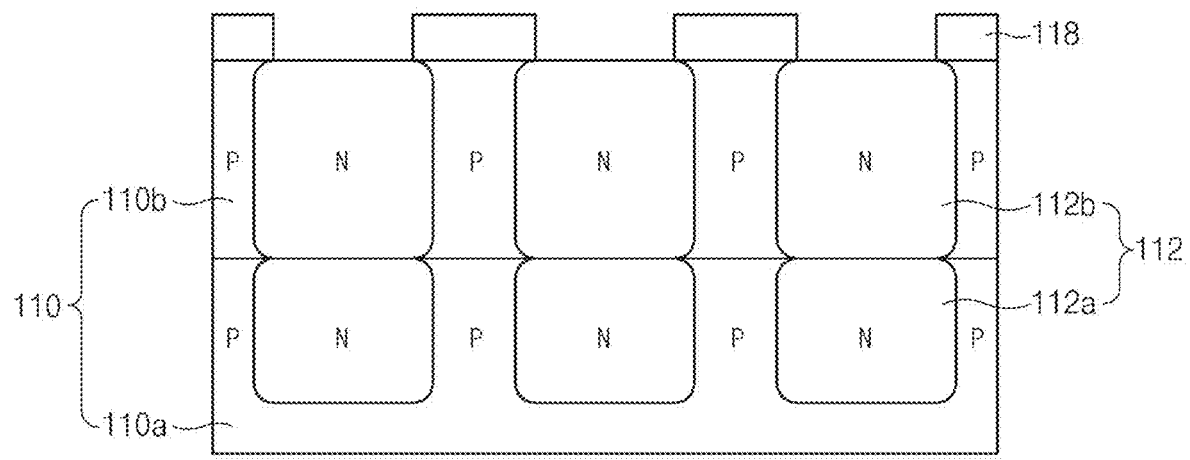

Referring to FIG. 3C, P-type impurities may be implanted into the second substrate 110b. For example, boron (B) ions corresponding to low-density P-type impurities may be implanted into the second substrate 110b through ion implantation. Alternatively, when the silicon epitaxial layer 110b is formed, P-type impurities may be doped using an in-situ process, such that the second substrate 110b formed by implantation of P-type impurities may also be formed as necessary.

Subsequently, the mask pattern 118 formed to define the second photoelectric conversion element 112b may be formed over the second substrate 110b. The mask pattern 118 may include a photoresist pattern, and may have the same size as the mask pattern 116 as shown in FIG. 3A.

Subsequently, N-type impurities may be implanted into the second substrate 110b using the mask pattern 118 as an ion implantation mask, resulting in formation of the second photoelectric conversion element 112b.

The second photoelectric conversion element 112b may be formed to contact the first photoelectric conversion element 112a, and at the same time may be formed to contact a top surface of the second substrate 110b. In some implementations, the second photoelectric conversion element 112b may have the same width as the first photoelectric conversion element 112a.

Figure 3D:
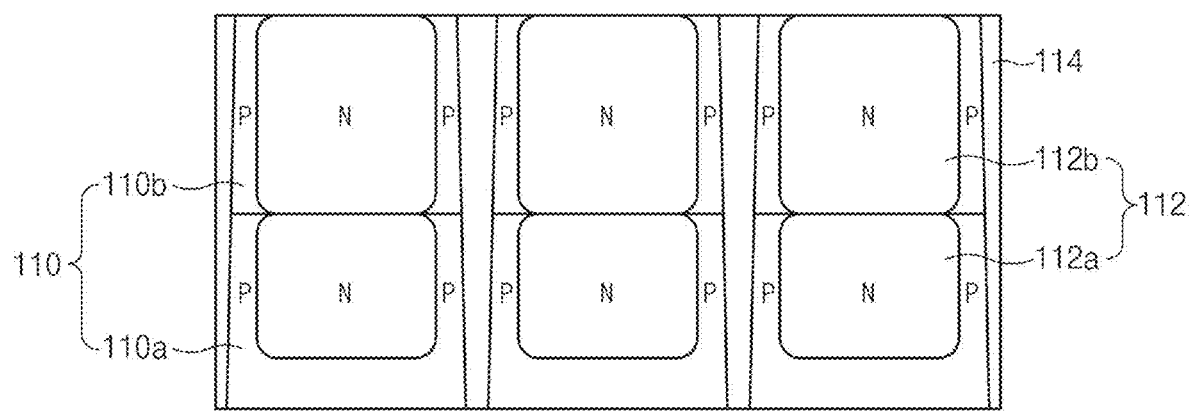

Referring to FIG. 3D, after the mask pattern 118 is removed, the first substrate 110a and the second substrate 110b may be etched, resulting in formation of a device isolation trench formed to define the unit pixel region.

Subsequently, an insulation layer formed of or including insulation materials capable of burying the device isolation trench may be formed, resulting in formation of the device isolation film 114. In some implementations, the device isolation film 14 may be formed to pass through the first substrate 110a and the second substrate 110b.

Thereafter, the buffer layer 120, the grid structure 140, the color filter layer 130, and the lens layer 150 may be formed over the second substrate 110b.

In accordance with the present embodiment of the disclosed technology, the photoelectric conversion elements 112 can have a deep depth by forming the first photoelectric conversion element 112a and the second photoelectric conversion element 112b in different steps. As compared to the case in which the photoelectric conversion elements 112 having the deep depth is formed in a single step, the present implementations allow to reduce the required ion implantation energy to form the photoelectric conversion elements 112. Given that each of the first photoelectric conversion element 112a and the second photoelectric conversion element 112b is formed with the half of the deep depth, the ion implantation energies required to form the first photoelectric conversion element 112a and the second photoelectric conversion element 112b would be not as high as those required to form the photoelectric conversion element having the deep depth. As a result, the resultant photoelectric conversion element 112 having a deep depth can be formed without using high ion implantation energy.

As the size of each unit pixel is gradually reduced with the trend toward miniaturization, there are more depends for a photoelectric conversion element having a deep depth for high resolution. In order to provide the photoelectric conversion element having a deep depth, higher energy is needed for ion implantation. The implementations of the disclosed technology suggest forming the photoelectric conversion element having the deep depth in multiple steps by forming multiple photoelectric conversion elements that are formed in the respective substrates to provide the photoelectric conversion element having the deep depth. For example, the photoelectric conversion element 112 includes the first photoelectric conversion element 112a formed in the first substrate 110a and the second photoelectric conversion element 112b formed in the second substrate 110b.

When the first photoelectric conversion element 112a is formed in the first substrate 110a and the second photoelectric conversion element 112b is formed in the second substrate 110b, ion implantation can be carried out with low energy as compared to the case to form the photoelectric conversion element with the deep depth at one time. In addition, since the energy level required for the ion implantation process is reduced, the ion implantation mask need not have a high height as compared to the case of forming the photoelectric conversion element with the deep depth at one time.

In the above, the first photoelectric conversion element 112a is formed in the first substrate 110a, the second substrate 110b is then grown at the first substrate 110a, and the second photoelectric conversion element 112b is finally formed in the second substrate 110b. The order of forming the first photoelectric conversion element 112a and the second photoelectric conversion element 112b can be changed.

For example, the second photoelectric conversion element 112b is first formed in the second substrate 110b, the first substrate 110a is then grown at the second substrate 110b, and the first photoelectric conversion element 112a is finally formed in the first substrate 110a.

Figure 4:
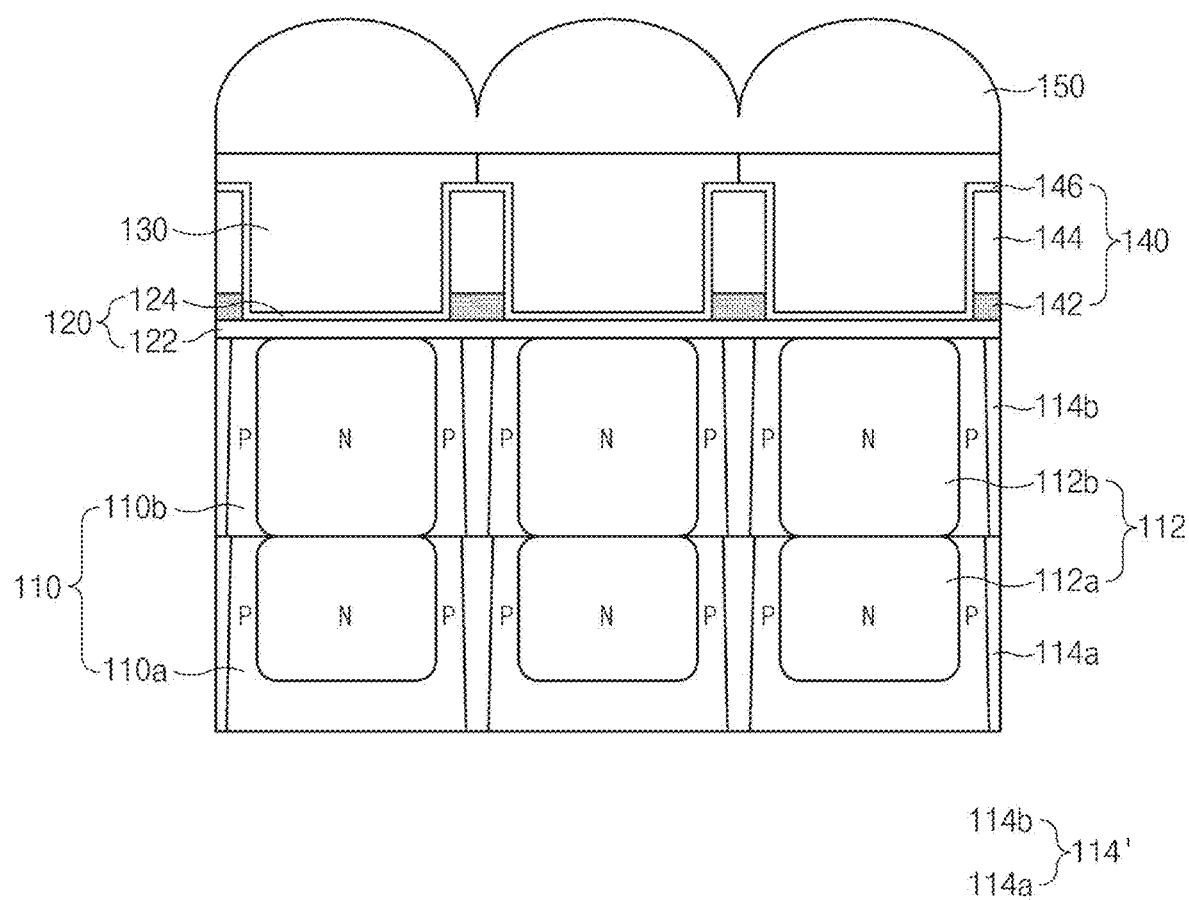
FIG. 4 is a cross-sectional view illustrating another example of a pixel array taken along the line A-A' shown in FIG. 1 based on some implementations of the disclosed technology.

FIG. 4 is a cross-sectional view illustrating another example of the pixel array taken along the line A-A' shown in FIG. 1 based on some implementations of the disclosed technology.

Referring to FIG. 4, the device isolation film 114' may include a first device isolation film 114a that is formed in the first substrate 110a so as to isolate the first photoelectric conversion elements 112a from one another, and a second device isolation film 114b that is formed in the second substrate 110b so as to isolate the second photoelectric conversion elements 112b from one another.

For example, the device isolation film 114' may include a stacked structure of the first device isolation film 114 formed to pass through the first substrate 110a and the second device isolation film 114b formed to pass through the second substrate 110b.

In the fabrication processes shown in FIGS. 3A to 3D, prior to formation of the second substrate 110b after completion of the first photoelectric conversion elements 112a formed in the first substrate 110a, the first substrate 110a may be etched to form a trench, and an insulation material may be buried in the trench, resulting in formation of the first device isolation film 114a.

In the fabrication processes shown in FIGS. 3A to 3D, after completion of the second photoelectric conversion elements 112b formed in the second substrate 110b, the second substrate 110b may be etched to form a trench, and an insulation material may be buried in the trench, resulting in formation of the second device isolation film 114b.

As can be seen from FIG. 4, although the device isolation film 114' shown in FIG. 4 is different in structure from the device isolation film 114 shown in FIG. 2, the remaining constituent elements other than the device isolation film 114' in FIG. 4 may be identical in structure to those of FIG. 2, and as such a detailed description thereof will herein be omitted.

As is apparent from the above description, the image sensing device and the method for forming the same according to the embodiments of the disclosed technology can provide a photoelectric conversion element having a deep depth, resulting in an increased light efficiency.

Although a number of illustrative embodiments have been described, it should be understood that numerous other modifications and embodiments can be devised by those skilled in the art. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A method for forming an image sensing device, comprising:

forming a first photoelectric conversion element in a first substrate by implanting first-type impurities into the first substrate;

providing a second substrate over the first substrate; and forming a second photoelectric conversion element in the second substrate by implanting the first-type impurities into the second substrate, the second photoelectric conversion element being in contact with the first photoelectric conversion element, wherein the first photoelectric conversion element and the second photoelectric conversion element form a single photoelectric conversion element by contacting each other.

2. The method of claim 1, wherein the first-type impurities include N-type impurities.

3. The method of claim 1, further comprising, before the forming of the first photoelectric conversion element, implanting second-type impurities into the first substrate.

4. The method of claim 1, further comprising, before the forming of the second photoelectric conversion element, implanting second-type impurities into the second substrate.

5. The method of claim 1, wherein ion implantation energies required for each of the forming of the first photoelectric conversion element and the forming of the second photoelectric conversion element are lower than ion implantation energies required for forming of photoelectric conversion element in a single substrate; and a depth of the photoelectric conversion element in the single substrate is same as a sum of the depth of the first photoelectric conversion element and the second photoelectric conversion element.

6. The method of claim 1, wherein the second photoelectric conversion element extends to contact a bottom surface and a top surface of the second substrate.

7. The method of claim 1, further comprising, after the forming of the second photoelectric conversion element:

forming a device isolation structure in the first substrate and the second substrate.

8. The method of claim 1, wherein the single photoelectric conversion element is disposed in a unit pixel configured to generate a pixel signal.

9. A method for forming an image sensing device, comprising:

forming a first portion of a photoelectric conversion element in a first substrate;

disposing a second substrate over the first substrate including the first portion of the photoelectric conversion element; and forming, in the second substrate, a second portion of the photoelectric conversion element having a top surface and a bottom surface such that the bottom surface of the second portion of the photoelectric conversion element contacts a surface of the first portion of the photoelectric conversion element.

10. The method of claim 9, further comprising, before the forming of the first portion of the photoelectric conversion element;

implanting first type impurities into the first substrate.

11. The method of claim 10, wherein the forming of the first portion of the photoelectric conversion element includes implanting second type impurities into the first substrate, the second type impurities different from the first type impurities.

12. The method of claim 9, wherein the first substrate includes a semiconductor substrate and the second substrate includes a silicon epitaxial layer.

13. The method of claim 9, further comprising, after the disposing of the second substrate:

implanting first type impurities into the second substrate.

14. The method of claim 13, wherein the forming of the second portion of the photoelectric conversion element includes implanting second type impurities into the first substrate, the second type impurities different from the first type impurities.

15. The method of claim 9, wherein the second portion of the photoelectric conversion element extends to contact a bottom surface and a top surface of the second substrate.

16. The method of claim 9, further comprising, after the forming of the second portion of the photoelectric conversion element:

forming a device isolation structure in the first substrate and the second substrate.

17. The method of claim 9, wherein the photoelectric conversion element is disposed in a unit pixel configured to generate a pixel signal.

* * * * *